United States Patent
Chowdhury et al.

(10) Patent No.: US 9,590,148 B2
(45) Date of Patent: Mar. 7, 2017

(54) ENCAPSULANT MODIFICATION IN HEAVILY PHOSPHOR LOADED LED PACKAGES FOR IMPROVED STABILITY

(71) Applicant: GE Lighting Solutions, LLC, East Cleveland, OH (US)

(72) Inventors: Ashfaqul Islam Chowdhury, East Cleveland, OH (US); Gary Robert Allen, East Cleveland, OH (US); Dengke Cai, Willoughby, OH (US)

(73) Assignee: GE Lighting Solutions, LLC, East Cleveland, OH (US)

( * ) Notice: Subject to any disclaimer, the term of this patent is extended or adjusted under 35 U.S.C. 154(b) by 0 days.

(21) Appl. No.: 14/217,873

(22) Filed: Mar. 18, 2014

(65) Prior Publication Data

US 2015/0270452 A1    Sep. 24, 2015

(51) Int. Cl.

| | | |
|---|---|---|
| *H01L 21/00* | (2006.01) | |
| *H01L 33/00* | (2010.01) | |
| *H01L 23/29* | (2006.01) | |
| *H01L 33/50* | (2010.01) | |
| *H01L 33/48* | (2010.01) | |
| *H01L 33/56* | (2010.01) | |
| *C09K 11/61* | (2006.01) | |
| *C09K 11/77* | (2006.01) | |

(52) U.S. Cl.
CPC .......... *H01L 33/504* (2013.01); *C09K 11/617* (2013.01); *C09K 11/7774* (2013.01); *H01L 33/483* (2013.01); *H01L 33/507* (2013.01); *H01L 33/56* (2013.01); *H01L 33/501* (2013.01); *H01L 33/505* (2013.01); *H01L 2933/005* (2013.01); *H01L 2933/0041* (2013.01)

(58) Field of Classification Search
CPC .............. C09K 11/617; C09K 11/7774; H01L 2933/0041; H01L 2933/005; H01L 33/483; H01L 33/501; H01L 33/504; H01L 33/505; H01L 33/507; H01L 33/56
USPC ...................................... 257/98, 791; 438/27
See application file for complete search history.

(56) References Cited

U.S. PATENT DOCUMENTS

| | | |
|---|---|---|
| 5,998,925 A | 12/1999 | Shimizu et al. |
| 6,590,235 B2 | 7/2003 | Carey |
| 7,497,973 B2 | 3/2009 | Radkov et al. |
| 7,521,728 B2 | 4/2009 | Andrews |

(Continued)

FOREIGN PATENT DOCUMENTS

| | | |
|---|---|---|
| DE | 102004052902 A1 | 6/2005 |
| EP | 0890996 A2 | 1/1999 |

(Continued)

OTHER PUBLICATIONS

Non-Final Rejection towards related U.S. Appl. No. 14/217,831 dated Jun. 18, 2015.

(Continued)

*Primary Examiner* — Teresa M Arroyo
(74) *Attorney, Agent, or Firm* — GE Global Patent Operation

(57) ABSTRACT

Heavily phosphor loaded LED packages having higher stability and a method for increasing the stability of heavily phosphor loaded LED packages. The silicone content of the packages is increased by decreasing the amount of one phosphor of the blend or by increasing the thickness of the silicone phosphor blend layer.

3 Claims, 1 Drawing Sheet

(56) References Cited

U.S. PATENT DOCUMENTS

| | | | |
|---|---|---|---|
| 8,252,613 B1 | 8/2012 | Lyons et al. | |
| 9,018,661 B2 | 4/2015 | Pindl et al. | |
| 2004/0104391 A1* | 6/2004 | Maeda | C09K 11/025 257/79 |
| 2007/0241666 A1 | 10/2007 | Jang et al. | |
| 2009/0140630 A1 | 6/2009 | Kijima et al. | |
| 2009/0272996 A1 | 11/2009 | Chakraborty | |
| 2010/0091215 A1* | 4/2010 | Fukunaga | C09K 11/664 349/61 |
| 2010/0110659 A1* | 5/2010 | Nakajima | H05K 1/183 362/84 |
| 2010/0142189 A1 | 6/2010 | Hong et al. | |
| 2010/0200874 A1 | 8/2010 | Shioi et al. | |
| 2010/0230693 A1 | 9/2010 | Tran | |
| 2010/0230708 A1 | 9/2010 | Tran | |
| 2010/0276712 A1 | 11/2010 | Shaikevitch et al. | |
| 2011/0031516 A1 | 2/2011 | Basin et al. | |
| 2012/0043573 A1 | 2/2012 | Mitsuishi et al. | |
| 2012/0235169 A1* | 9/2012 | Seko | H01L 33/60 257/88 |
| 2012/0241797 A1* | 9/2012 | Kim | H01L 33/505 257/98 |
| 2013/0082289 A1 | 4/2013 | Sakuta et al. | |
| 2013/0200413 A1 | 8/2013 | Kashiwagi et al. | |
| 2013/0277694 A1 | 10/2013 | Sakuta et al. | |
| 2013/0334558 A1 | 12/2013 | Pindl et al. | |
| 2014/0175492 A1 | 6/2014 | Steranka et al. | |
| 2014/0291715 A1* | 10/2014 | Reiherzer | H01L 33/60 257/98 |
| 2015/0270451 A1* | 9/2015 | Chowdhury | C09K 11/617 257/98 |

FOREIGN PATENT DOCUMENTS

| | | |
|---|---|---|
| EP | 2629341 A1 | 8/2013 |
| JP | 2010251621 A | 11/2010 |
| WO | 2012084516 A1 | 6/2012 |
| WO | 2012107263 A2 | 8/2012 |
| WO | 2013023971 A1 | 2/2013 |
| WO | 2013174977 A1 | 11/2013 |
| WO | 2014016214 A1 | 1/2014 |

OTHER PUBLICATIONS

U.S. Appl. No. 14/217,831, filed Mar. 18, 2014, Ashfaqul Islam Chowdhury.

International Search Report and Written Opinion issued in connection with related PCT Application No. PCT/US2015/017010 dated Apr. 30, 2015.

PCT Search Report and Written Opinion issued in connection with corresponding Application No. PCT/US2015/014056 on Apr. 15, 2015.

Bit Tie Chan, "Phosphor Film Conversion for White LEDS"; Feb. 4, 2011 Convergence Promotions LLC ; Digi-Key Corporation.

\* cited by examiner

ENCAPSULANT MODIFICATION IN HEAVILY PHOSPHOR LOADED LED PACKAGES FOR IMPROVED STABILITY

I. FIELD OF THE INVENTION

The present disclosure relates generally to light emitting diodes (LEDs) that are phosphor loaded. More particularly, the present disclosure relates to heavily phosphor loaded LED packages having higher stability and methods for increasing the stability of heavily phosphor loaded LED packages.

II. BACKGROUND OF THE INVENTION

LEDs are semiconductor light emitters often used as replacements for other light sources, such as incandescent lamps. They are particularly useful as illumination sources in applications where discretized or highly concentrated light is desired. The color of light produced by an LED package is dependent on the type of semiconducting material used in its manufacture and, where a phosphor system is used, the phosphor or phosphor blend that is used.

Colored semiconductor LEDs, including light emitting diodes and lasers (both are generally referred to herein as LEDs), have been produced from Group III-V alloys such as gallium nitride (GaN). With reference to the GaN-based LEDs, light is generally emitted in the UV to green range of the electromagnetic spectrum. Until more recently, LEDs have not been suitable for lighting uses where a bright white light is needed, due to the inherent color of the light produced by the LED.

Phosphors convert radiation (energy) to visible light. Different combinations of phosphors provide different colored light emissions. The color of the generated visible light is dependent on the particular components of the phosphor. The phosphor material may include only a single phosphor or two or more phosphors of basic color, for example a particular mix with one or more of a yellow and red phosphor to emit a desired color (tint) of light. As used herein, the terms "phosphor" and "phosphor material" may be used to denote both a single phosphor composition as well as a blend of two or more phosphor compositions.

In typical applications where "white" light is desired, phosphors are used in conjunction with LEDs to provide an acceptable net emission spectrum of desired characteristics. "White" light is typically defined as being close to the black body locus in color in regions of Correlated Color Temperatures (CCT) of 2500K to 6000K. For example, in a typical luminaire application, LEDs made from InGaN (Indium Gallium Nitride) that emit in the blue region of the electromagnetic spectrum are used in conjunction with yellow, green, and red phosphors to provide composite spectral outputs ranging from about 2500 K CCT to above 6000 K CCT. The resultant color temperature and color point in the CIE tristimulus plot depends on the output spectral power and wavelength of the diode emitter, the blend ratio, conversation characteristics, and amounts of phosphors used.

U.S. Pat. No. 7,497,973 discloses LEDs including a semiconductor light source and a phosphor material including a complex phosphor activated with $Mn^{4+}$. The particular phosphor material is $K_2[SiF_6]:Mn^{4+}$ (potassium fluoride silicon or PFS). Any of the narrow red phosphors discussed in this patent can be used in the present invention.

Another LED uses a combination of the PFS phosphor and the phosphor BSY (blue-shifted Yttrium Aluminum Garnet (YAG)). This combination is called BSY-PFS and it yields a white light. One preferred embodiment of an LED package using a BSY-PFS combination is a low to mid power LED package (<1W), used as an exemplary embodiment herein. One example of such a package is fabricated using Nichia Mint Phosphor (BSY) and GE PFS phosphor in a Nichia 757 package. The usage of garnet phosphors in white LEDs is covered under U.S. Pat. Nos. 5,998,925 and 7,026,756. To those skilled in the art it will be evident that the implementation of the inventive elements is not limited to the Nichia 757. The invention can be implemented in a number of different LED packages where PFS is used in conjunction with a BSY phosphor or a spectrally similar phosphor.

Accordingly, the use of phosphors in LED packages provides advantages and is common. However, in general, LED packages that include PFS phosphor exhibit long term color and lumen stability issues. For example, the color requirements of the BSY-PFS system at 4000K Hi CRI (color rendering index) necessitates very high phosphor loading of the silicone/phosphor disk/mold. In reliability tests in the presence of humidity, the resulting visible radiation from the energized LED packages shift color. Mainly the red component of the spectral power distribution loses intensity gradually over operating time. The high phosphor loading also results in side wall "trench" formations and other effects that result in net color point shift.

The above-described shortcomings significantly limit the usefulness of low and mid power PSF LEDs such as the BSY-PSF LED. Therefore, it would be useful to have LED package level improvements that mitigate color instability issues.

This invention relates to improving the stability of LED packages using PFS phosphor. Generally in such packages the phosphor loading is high as mentioned above. High loading in this context refers to phosphor to silicone weight ratios of 20%, 30% and higher.

III. SUMMARY OF THE INVENTION

In at least one aspect, the present disclosure provides methods to improve the long term stability and reliability of LED packages that employ PFS phosphor systems. One exemplary embodiment is the Nichia 757 mid power LED package, which is highly loaded with a BSY-PFS phosphor blend.

In another aspect, the present disclosure provides heavily phosphor loaded LED packages having higher stability.

The methods to improve long term stability involve increasing the weight ratio of silicone versus phosphor, thus providing protection to the phosphor and increasing stability. The weight ratio can be increased in at least two ways, both of which increase stability while substantially maintaining acceptable performance.

In one method to improve the stability of heavily phosphor loaded LED packages, the LED package cavity is increased in size and a silicone phosphor blend is used having a higher silicone weight ratio, while keeping the total amount of phosphor the same.

In a second method, the silicone phosphor blend ratio is adjusted to increase the silicone content while maintaining the phosphor content at an acceptable level.

IV. BRIEF DESCRIPTION OF THE DRAWINGS

Figure 1:
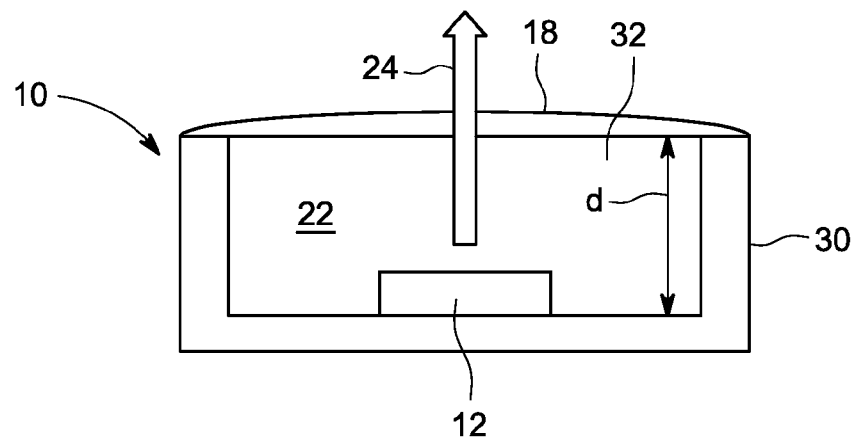
FIG. 1 illustrates a schematic view of an LED of the prior art.

The present disclosure may take form in various components and arrangements of components, and in various process operations and arrangements of process operations. The present disclosure is illustrated in the accompanying drawings, throughout which like reference numerals may indicate corresponding or similar parts in the various figures. The drawings are only for purposes of illustrating preferred embodiments and are not to be construed as limiting the disclosure. Given the following enabling description of the drawings, the novel aspects of the present disclosure should become evident to a person of ordinary skill in the art.

V. DETAILED DESCRIPTION

The following detailed description is merely exemplary in nature and is not intended to limit the applications and uses disclosed herein. Further, there is no intention to be bound by any theory presented in the preceding background or summary or the following detailed description. While embodiments of the present technology are described herein primarily in connection with PFS LED packages, and especially low and mid power LED packages such as the Nichia 757 BSY-PFS LED package, the concepts are also applicable to other types of phosphor loaded LEDs and especially with other types of heavily phosphor loaded LEDs. Specifically, the concepts are most applicable in LED packages where the phosphor to silicone weight ratio is high (20%, 30% and higher) and at least one of the phosphors exhibits sensitivity to ambient atmospheric constituents such as moisture.

FIG. 1 shows an exemplary prior art LED package 10. The package 10 comprises a light emitting diode (LED) chip 12. A phosphor and silicone blend layer 22 overlays the chip 12. The LED chip 12 and phosphor silicone blend layer 22 are encapsulated with a lens 18. The LED package 10 includes an outside enclosure 30 that defines a cavity 32 in which the LED chip 12 and phosphor and silicone blend layer 22 are retained. Cavity 32 has a depth "d". The phosphor silicone blend layer 22 is radiationally coupled to the LED chip 12 in the direction indicated by arrow 24. Radiationally coupled means that the elements are associated with each other so that at least part of the radiation emitted from one is transmitted to the other.

In the prior art package described above, a certain amount of phosphor blend is required to achieve the desired white light. In addition, the amount of silicone is important in order to achieve necessary manufacturing requirements. These factors and the size of the cavity 32 determine the preferred relative percentages of the phosphor and silicone in the phosphor silicone blend layer 22.

Figure 2:
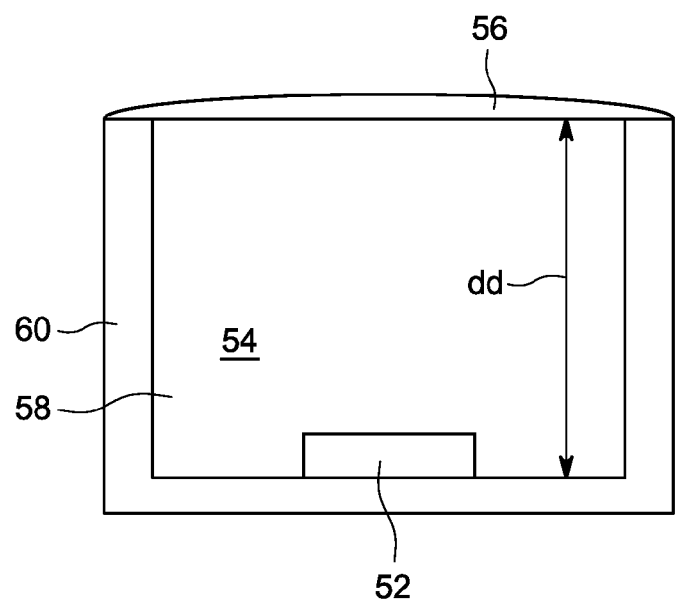
FIG. 2 illustrates an LED package having a deeper cavity and a silicone phosphor blend with a higher silicone weight percentage.

One embodiment of an LED package 50 according to the present invention is shown in FIG. 2. An LED chip 52 is overlayed with a phosphor and silicone blend layer 54. This layer 54 is optionally covered with a lens 56. The LED chip 52 and silicone phosphor blend 54 are retained in a cavity 58 created by an outside enclosure 60.

The silicone phosphor blend layer 54 comprises a silicone and a phosphor blend. Desirably the silicone phosphor blend is heavily loaded with phosphor (greater than 20%) and includes a narrow red phosphor as a component of the phosphor blend. An example is the $K_2[SiF_6]:Mn^{4+}$ phosphor (potassium fluoride silicon or PFS). The phosphor blend can also include the phosphor BSY (blue-shifted Yttrium Aluminum Garnet (YAG)). This combination is called BSY-PFS.

In a preferred embodiment the LED package is a low to mid power LED package (<1W).

Cavity 58 has a depth "dd". The depth "dd" of cavity 58 is greater than the depth "d" of cavity 32, meaning that the silicone phosphor layer 54 has a larger volume than the layer 22 in the prior art device. Since the amount of phosphor can remain the same for proper functioning, the amount of silicone can be increased in the blend, which protects the phosphor and provides an improvement in color shift.

The cavity depth "dd" can be increased an additional 0.3 to 3 times the current depth "d" of LED packages. In other words dd ranges from about 1.3d to 3d. For example, the Nichia 757 package has a cavity depth of 300 microns. An increased cavity depth of 400 microns to 900 microns would be desirable. The table below illustrates the effect of increasing dd on the silicone weight percent.

TABLE 1

|            | 300 | 400  | 450  | 600  | 900  |
|------------|-----|------|------|------|------|
| PFS (wt %) | 44  | 36.3 | 33.4 | 26.9 | 19.3 |
| BSY (wt %) | 11  | 9.1  | 8.3  | 5    | 4.8  |
| Si (wt %)  | 45  | 54.6 | 58.3 | 66.4 | 75.8 |

In a second embodiment of the invention, the absolute mass content of the PFS phosphor in the BSY-PFS blend is reduced. This may reduce the red content of the resultant spectral power distribution of the LED but will improve the robustness in operation. The amount of PFS can be reduced with an acceptable tradeoff in color temperature and/or color rendering index (CRI).

In order to provide enough red emission in the spectrum from PFS phosphor, the silicone weight percentage is generally near its allowable minimum value as determined by the required viscosity of a blend in the manufacturing process for a given conventional LED package (such as the Nichia 757). In other words the preferred ranges and ratios for PFS: BSY: silicone are 35-40: 10-12: 48-52.

The weight percentage of PFS in a comparative PFS-BSY silicone blend (that used in the Nichia 757 mid power package) is about 40% by weight. The total amount of PFS in the blend can be reduced to about 36% to allow the silicone weight percent to be increased to about 53% from 49% (the BSY is maintained at 11%).

The packages described herein may include any semiconductor visible or UV light source that is capable of producing white light when its emitted radiation is directed onto the phosphor. The preferred peak emission of the LED chip will depend on the identity of the phosphors used and may range from, e.g., 250-550 nm. In one preferred embodiment, however, the emission of the LED will be in the violet to blue-green region and have a peak wavelength in the range from about 420 to about 500 nm. Typically then, the semiconductor light source comprises an LED doped with various impurities. Thus, the LED may comprise a semiconductor diode based on any suitable III-V, II-VI or IV-IV semiconductor layers and having a peak emission wavelength of about 250 to 550 nm.

Although the general discussion of the exemplary structures of the invention discussed herein are directed toward inorganic LED based light sources, it should be understood that the LED chip may be replaced by an organic light emissive structure or other radiation source unless otherwise noted and that any reference to LED chip or semiconductor is merely representative of any appropriate radiation source.

The lens may be, for example, an epoxy, plastic, low temperature glass, polymer, thermoplastic, thermoset material, resin, or other type of LED encapsulating material as is known in the art. Optionally, the lens is a spin-on glass or some other material having a high index of refraction. In one preferred embodiment, the lens is a polymer material, such as epoxy, silicone, or silicone epoxy, although other organic or inorganic encapsulants may be used.

The lens is preferably transparent or substantially optically transmissive with respect to the wavelength of light produced by the LED chip and phosphor silicone blend material. In an alternate embodiment, the package may include an encapsulant material without an outer lens.

The outside enclosure of the LED package is typically made of polymeric composite material EMC (Epoxy Moldable Compound). The LED chip may be supported, for example, by a lead frame (not shown), by the self-supporting electrodes, the bottom of the enclosure, or by a pedestal (not shown) mounted to the shell or to the lead frame. The LED chip is electrically attached to electrical contacts at the bottom surface of the outside enclosure. It is known to those skilled in the art that there could be multiple chips present in LED packages that have similar functional attributes.

EXAMPLES

Table 2 shows the net improvement in color stability between Nichia 757 LEDs with BSY-PFS blends of varying phosphor loading. The total amount of phosphor (BSY+PFS) used in the silicone phosphor blend was varied from 47% by weight to 51% by weight. The amount of BSY was constant at 11 wt % and the PFS was from 36 to 40%. Silicone was 49 to 53%. The LED drive and ambient conditions were kept the same. The LED operating conditions were 30 mA in a 47 C constant temperature. Observations to 1500 hours indicate greater than 50% improvement in color shift by reducing PFS phosphor loading from 40 to 36% (total phosphor from 51% to 47% and increasing silicone from 49 to 53%.

TABLE 2

| Sample Type | Color Shift in MPCD after Hours of Operation | | |
|---|---|---|---|
| | 100 | 500 | 1500 |
| With 51% Phosphor Loading | 0.12 | 0.22 | 0.7 |

TABLE 2-continued

| Sample Type | Color Shift in MPCD after Hours of Operation | | |
|---|---|---|---|
| | 100 | 500 | 1500 |
| With 47% Phosphor Loading | 0.07 | 0.19 | 0.39 |

Table 3 below shows a directional comparison between CCT and Phosphor loading. As the PFS portion of the loading is reduced from 40% to 36% there is a net ~200 K drop in CCT. In most cases, industry standard tolerances for acceptable color temperature variation can accommodate such ranges of variations.

TABLE 3

| PFS content, % | LED CCT, K |
|---|---|
| 36 | 3932 |
| 40 | 4156 |

Alternative embodiments, examples, and modifications which would still be encompassed by the disclosure may be made by those skilled in the art, particularly in light of the foregoing teachings. Further, it should be understood that the terminology used to describe the disclosure is intended to be in the nature of words of description rather than of limitation.

Those skilled in the art will also appreciate that various adaptations and modifications of the preferred and alternative embodiments described above can be configured without departing from the scope and spirit of the disclosure. Therefore, it is to be understood that, within the scope of the appended claims, the disclosure may be practiced other than as specifically described herein.

The invention claimed is:

1. A heavily phosphor loaded LED package having improved color stability, comprising:
    an LED and a silicone phosphor blend encapsulating the LED, wherein the silicone phosphor blend includes silicone in an amount of about 53 wt %, PFS phosphor in an amount of about 36 wt %, and BSY phosphor in an amount of about 11 wt %.

2. The LED package of claim 1, wherein the LED is a mid power LED, and the silicone phosphor blend is highly loaded with a BSY-PFS phosphor.

3. The LED package of claim 1, wherein the silicone phosphor blend provides at least a 25% improvement in color shift.

* * * * *